(12) United States Patent
Chang et al.

(10) Patent No.: US 10,381,347 B2
(45) Date of Patent: Aug. 13, 2019

(54) SEMICONDUCTOR APPARATUS

(71) Applicant: Nuvoton Technology Corporation, Hsinchu (TW)

(72) Inventors: Yu-Chi Chang, Hsinchu (TW); Wen-Ying Wen, Hsinchu (TW); Han-Hui Chiu, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 15/879,441

(22) Filed: Jan. 25, 2018

(65) Prior Publication Data

US 2018/0211958 A1  Jul. 26, 2018

(30) Foreign Application Priority Data

Jan. 25, 2017  (TW) .............................. 106102891 A

(51) Int. Cl.
| | | |
|---|---|---|
| *H01L 27/092* | (2006.01) | |
| *H01L 29/06* | (2006.01) | |
| *H01L 21/8238* | (2006.01) | |
| *H01L 21/761* | (2006.01) | |
| *H01L 29/10* | (2006.01) | |

(52) U.S. Cl.
CPC ........ *H01L 27/0922* (2013.01); *H01L 21/761* (2013.01); *H01L 21/823878* (2013.01); *H01L 27/0921* (2013.01); *H01L 29/0649* (2013.01); *H01L 21/823892* (2013.01); *H01L 29/1083* (2013.01)

(58) Field of Classification Search
CPC ........... H01L 21/761; H01L 21/823481; H01L 27/0285; H01L 27/0629; H01L 27/092; H01L 27/0928; H01L 29/0634; H01L 29/0642; H01L 29/0692; H01L 29/1075; H01L 29/1095; H01L 29/66128; H01L 29/66681

See application file for complete search history.

(56) References Cited

U.S. PATENT DOCUMENTS

| | | | |
|---|---|---|---|
| 9,012,979 B2* | 4/2015 | Moon ................. | H01L 29/7816 257/140 |
| 9,412,732 B2* | 8/2016 | Yamaji .................. | H01L 21/761 |
| 2009/0243764 A1* | 10/2009 | Hauenstein ............ | H01L 25/16 333/24 C |
| 2016/0071837 A1* | 3/2016 | Lee ..................... | H01L 27/0629 257/272 |
| 2016/0124055 A1* | 5/2016 | Ausserlechner ..... | G01R 33/075 324/251 |
| 2018/0211958 A1* | 7/2018 | Chang ............... | H01L 21/82387 |

FOREIGN PATENT DOCUMENTS

| | | |
|---|---|---|
| CN | 1181848 | 5/1998 |
| TW | 201145496 | 12/2011 |
| TW | 201547025 | 12/2015 |
| TW | 201601291 | 1/2016 |
| TW | 201644048 | 12/2016 |

* cited by examiner

*Primary Examiner* — Edward Chin
(74) *Attorney, Agent, or Firm* — JCIPRNET

(57) ABSTRACT

A semiconductor apparatus includes a high side region and a low side region, wherein the high side region includes semiconductor devices, and those semiconductor devices have at least two devices with different operating voltages. In the high side region, at least one isolation structure is located between the devices with different operating voltages to prevent short circuit between the devices.

11 Claims, 6 Drawing Sheets

SEMICONDUCTOR APPARATUS

CROSS-REFERENCE TO RELATED APPLICATION

This application claims the priority benefit of Taiwan application serial no. 106102891, filed on Jan. 25, 2017. The entirety of the above-mentioned patent application is hereby incorporated by reference herein and made a part of this specification.

BACKGROUND OF THE INVENTION

Field of the Invention

The invention relates to a semiconductor apparatus technique, and more particularly, to a semiconductor apparatus suitable for a half bridge gate driver.

Description of Related Art

A regular half bridge gate driver is divided into high side and low side regions, and the operating voltages of the two regions may differ by 100 V to 600 V or more, even 1200 V. In prior art, a "buried layer (NBL)" technique is used in a high voltage integrated circuit (HVIC) process to separate the two regions by voltage isolation.

The signal is transmitted from the low side region to the high side region via a level shift circuit, and therefore the high side region in a half bridge drive IC generally made by the HVIC process is only made of high voltage devices. Only high voltage devices are provided in the high side region because only a single high voltage operation is allowed in the high side end. However, since the properties of high voltage devices are worse and layout rule thereof is greater, in actual application, the overall chip is affected by drawbacks such as high cost and poor performance.

SUMMARY OF THE INVENTION

The invention provides a semiconductor apparatus that can apply low voltage devices in a high side region and prevent short circuit between high and low voltage devices.

A semiconductor apparatus of the invention includes a high side region and a low side region, wherein the high side region includes a plurality of semiconductor devices, and those semiconductor devices have at least two devices with different operating voltages. In the high side region, at least one isolation structure is further located between the devices with different operating voltages.

In an embodiment of the invention, the devices with different operating voltages include low voltage devices and high voltage devices.

In an embodiment of the invention, the device size of the low voltage devices is less than the device size of the high voltage devices.

In an embodiment of the invention, the at least one isolation structure is further located between different low voltage devices.

In an embodiment of the invention, the low voltage devices include low voltage N-type metal oxide semiconductors (LV NMOS) and low voltage P-type metal oxide semiconductors (LV PMOS).

In an embodiment of the invention, the high voltage devices include high voltage NMOS (HV NMOS) and high voltage PMOS (HV PMOS).

In an embodiment of the invention, the semiconductor devices of the high side region are formed on a substrate, and the high side region can further include a first conductivity type buried layer located between the substrate and the semiconductor devices.

In an embodiment of the invention, the first conductivity type buried layer is an N-type buried layer.

In an embodiment of the invention, the isolation structure includes a second conductivity type doped region completely surrounding the low voltage devices in the devices with different operating voltages.

In an embodiment of the invention, the second conductivity type doped region is a P-type doped region.

In an embodiment of the invention, the isolation structure includes a shallow-trench isolation structure (STI) passing through the first conductivity type buried layer.

In an embodiment of the invention, the isolation structure includes a second conductivity type isolation region and a second conductivity type buried layer, the second conductivity type isolation region is located between the devices with different operating voltages, and the second conductivity type buried layer is located between the first conductivity type buried layers at the bottom of the second conductivity type isolation region.

In an embodiment of the invention, the second conductivity type isolation region is fully depleted.

In an embodiment of the invention, the first conductivity type buried layer is an N-type buried layer, the second conductivity type isolation region is a P-type isolation region, and the second conductivity type buried layer is a P-type buried layer.

In an embodiment of the invention, the first conductivity type buried layer is a P-type buried layer, the second conductivity type isolation region is an N-type isolation region, and the second conductivity type buried layer is an N-type buried layer.

In an embodiment of the invention, the width of the second conductivity type isolation region can be determined according to the potential difference of the devices with different operating voltages.

Based on the above, in the invention, by using low voltage devices in the high side region, the effect of size reduction of the devices is achieved, and it is more efficient by designing an ordinary logic operation depending on low voltage devices and then outputting at high voltage. Moreover, in the invention, isolation structures are further disposed between devices with different operating voltages in the high side region, and therefore short circuit between high voltage devices and low voltage devices can be prevented.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
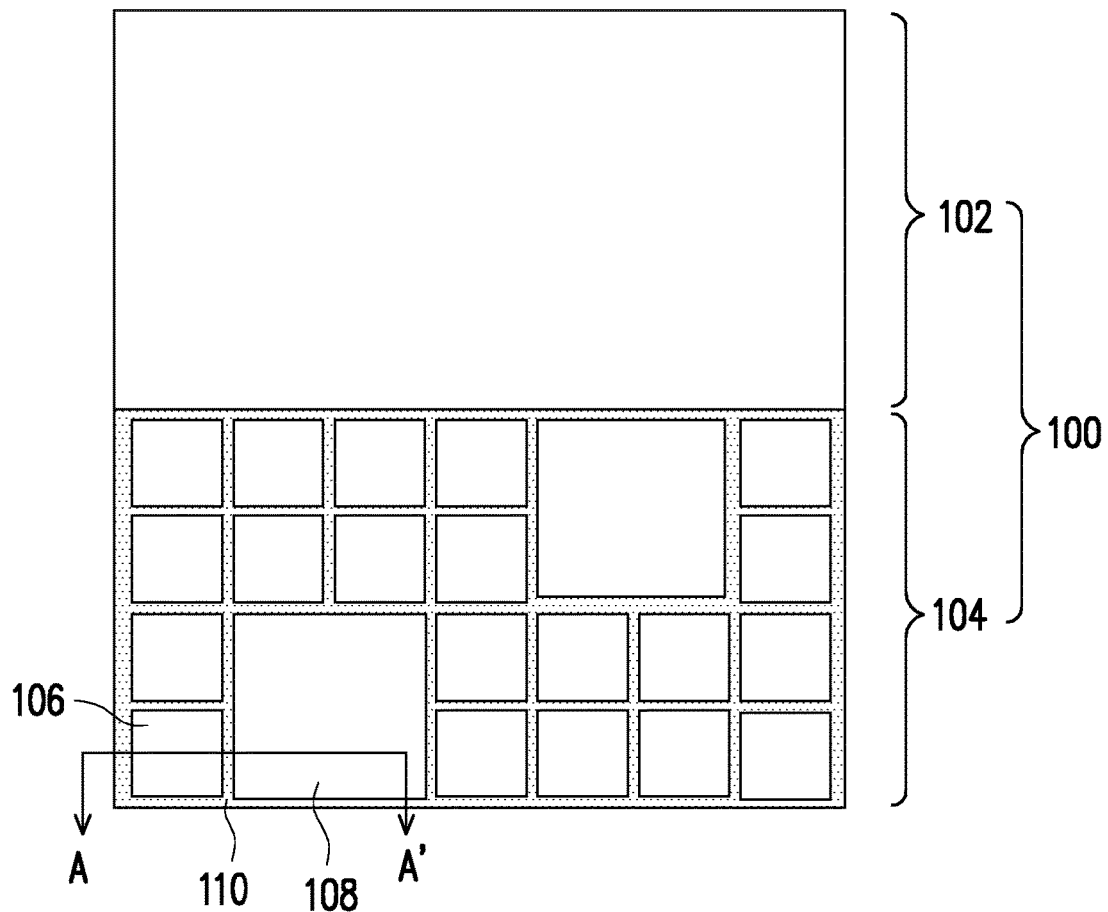
FIG. 1 is a top view of a semiconductor apparatus according to an embodiment of the invention.

Embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

Moreover, terms such as "first" and "second" used herein do not represent order, and it should be understood that they are only for differentiating devices or operations having the same technical terms.

Moreover, terms such as "contain", "include" and "have" used in the present specification are all open terms, i.e., contains but not limited to.

FIG. 1 is a top view of a semiconductor apparatus according to an embodiment of the invention.

Referring to FIG. 1, a semiconductor apparatus 100 of the present embodiment includes a low side region 102 and a high side region 104, wherein the low side region 102 can contain devices of the prior art and is therefore not shown in detail. The high side region 104 includes a plurality of semiconductor devices such as low voltage devices 106 and high voltage devices 108 with different operating voltages, and the high voltage devices 108 follow the layout rule, and therefore are significantly larger than the low voltage devices 106 in size. Moreover, in the present embodiment, isolation structures 110 are disposed between the low voltage devices 106 and the high voltage devices 108 with different operating voltages.

Since some of the high voltage devices in the high side region 104 are replaced by the low voltage devices 106, in comparison to the traditional high side region having only high voltage devices, the area of the high side region 104 can be significantly reduced via the design of the low voltage devices 106 since the device size of the low voltage devices 106 is generally less than the device size of the high voltage devices 108. Moreover, by disposing the isolation structures 110 between devices (106 and 108) with different operating voltages, the occurrence of short circuit can further be prevented, thus allowing the high side region 104 of the semiconductor apparatus 100 to execute a plurality of voltage operations.

Moreover, in the high side region 104 of FIG. 1, a square represents a single device, but the invention is not limited thereto; according to the technical field of the invention, semiconductor devices having various configurations can be designed in the high side region 104 as needed. Moreover, according to the present embodiment, the isolation structures 110 can be disposed between the low voltage devices 106, but the invention is not limited thereto; if the operating voltage between the low voltage devices 106 is adequate, then the isolation structures 110 can be omitted.

Figure 2:
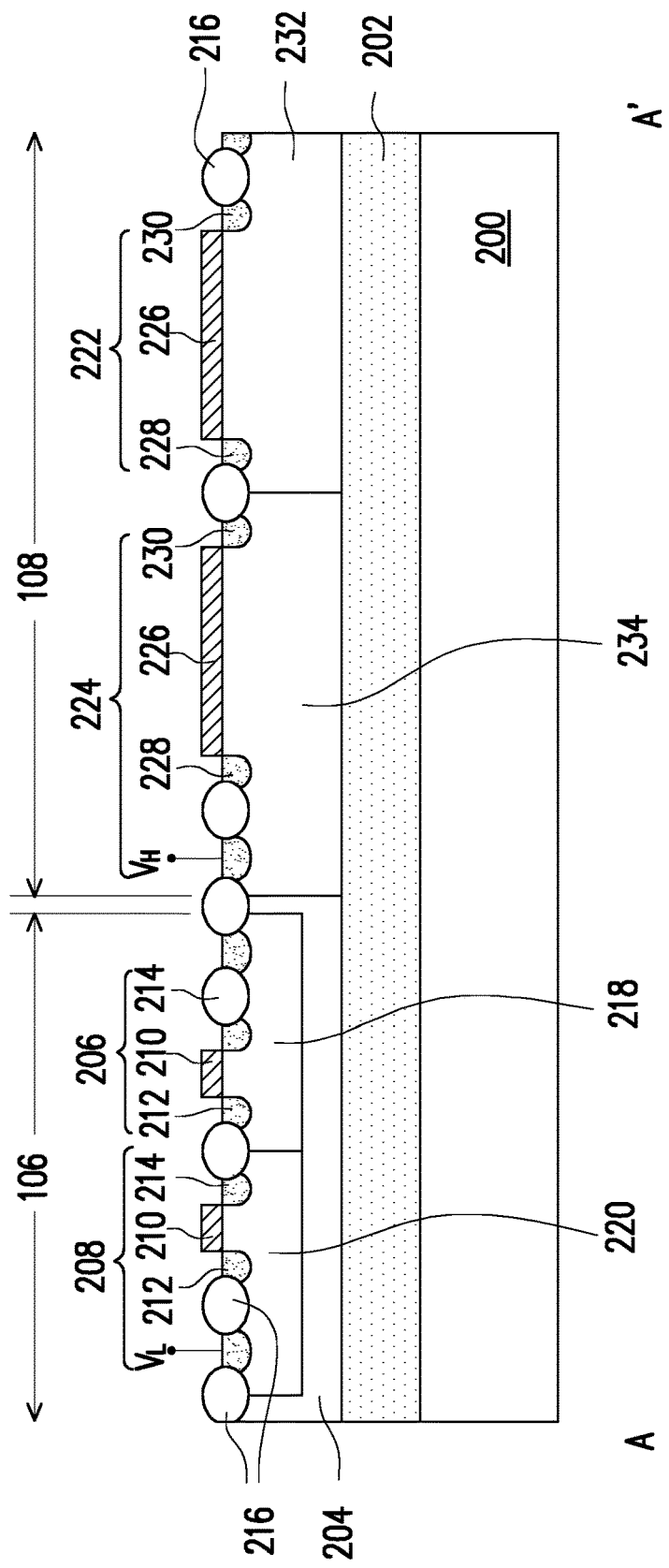
FIG. 2 is a cross-sectional schematic diagram of the first example of a high side region in the semiconductor apparatus taken along line A-A' in FIG. 1.

FIG. 2 is a cross-sectional schematic diagram of the first example of a high side region in the semiconductor apparatus taken along line A-A' in FIG. 1.

Referring to FIG. 2, the semiconductor devices of the first example include the low voltage devices 106 and the high voltage devices 108, and the low voltage devices 106 and the high voltage devices 108 are formed on a substrate 200. Moreover, a first conductivity type buried layer 202 is disposed between the substrate 200 and the low voltage devices 106 and the high voltage devices 108 for voltage isolation from the low side region (such as 102 of FIG. 1), wherein the first conductivity type buried layer 202 is, for instance, an N-type buried layer (NBL). In the first example, the isolation structure is a second conductivity type doped region 204, and the second conductivity type doped region 204 can completely surround the low voltage devices 106 in the devices with different operating voltages so as to isolate the low voltage devices 106 from the high voltage devices 108. For instance, the low voltage devices 106 in FIG. 2 are, for instance, formed by a low voltage N-type metal oxide semiconductor (LV NMOS) 206 and a low voltage P-type metal oxide semiconductor (LV PMOS) 208, the LV NMOS 206 and the LV PMOS 208 both include a gate 210, a source 212, and a drain 214, and structures such as field oxide (FOX) 216 separate the LV NMOS 206 and the LV PMOS 208. Moreover, a P well 218 is generally at the bottom of the LV NMOS 206, and an N well 220 is generally at the bottom of the LV PMOS 208. The high voltage devices 108 in FIG. 2 are, for instance, formed by a high voltage NMOS (HV NMOS) 222 and a high voltage PMOS (HV PMOS) 224, the HV NMOS 222 and the HV PMOS 224 also include a gate 226, a source 228, and a drain 230, and have a structure such as field oxide (FOX) 216 to separate the HV NMOS 222 and the HV PMOS 224. A P well 232 is generally at the bottom of the HV NMOS 222, and an N well 234 is generally at the bottom of the HV PMOS 224.

Therefore, when the HV PMOS 224 contained in the high voltage devices 108 is close to the LV NMOS 206 of the low voltage devices 106 in FIG. 2, a P-type doped region can be used as the second conductivity type doped region 204 surrounding the low voltage devices 106. The forming of the second conductivity type doped regions 204 can directly adopt a P base process in a low voltage device process. In other words, before the P well 218 and the N well 220 are formed, an implantation step is performed to form the P-type doped regions 204.

Figure 3:
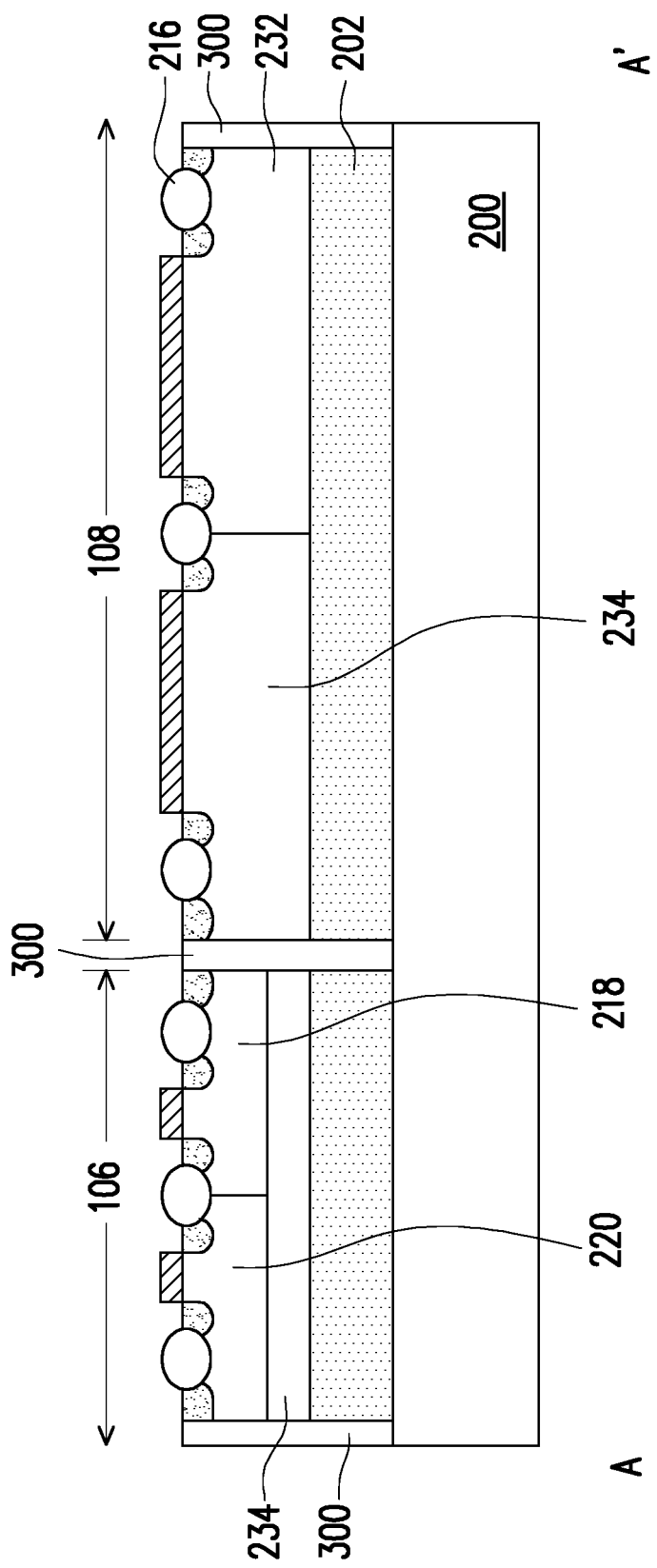
FIG. 3 is a cross-sectional schematic diagram of the second example of a high side region in the semiconductor apparatus taken along line A-A' in FIG. 1.

FIG. 3 is a cross-sectional schematic diagram of the second example of the high side region in the semiconductor apparatus taken along line A-A' in FIG. 1, wherein the same reference numerals as FIG. 2 are used to represent the same or similar components.

Referring to FIG. 3, in addition to the form of FIG. 2, the isolation structures of the invention can also adopt shallow trench isolation (STI) structures 300 reaching the first conductivity buried layer 202, and the STI structures 300 can be insulating materials such as oxide. Since a high voltage integrated circuit (HVIC) process may cause the first conductivity type buried layer 202 at the bottom of the high voltage devices 108 to also be present below the P well 218 and the N well 220 of the low voltage devices 106, leakage path can be effectively isolated via the STI 300 disposed between the low voltage devices 106 and the high voltage devices 108. Moreover, the STI 300 can also be used as internal isolation structures for the low voltage devices 106 and the high voltage devices 108.

Figure 4:
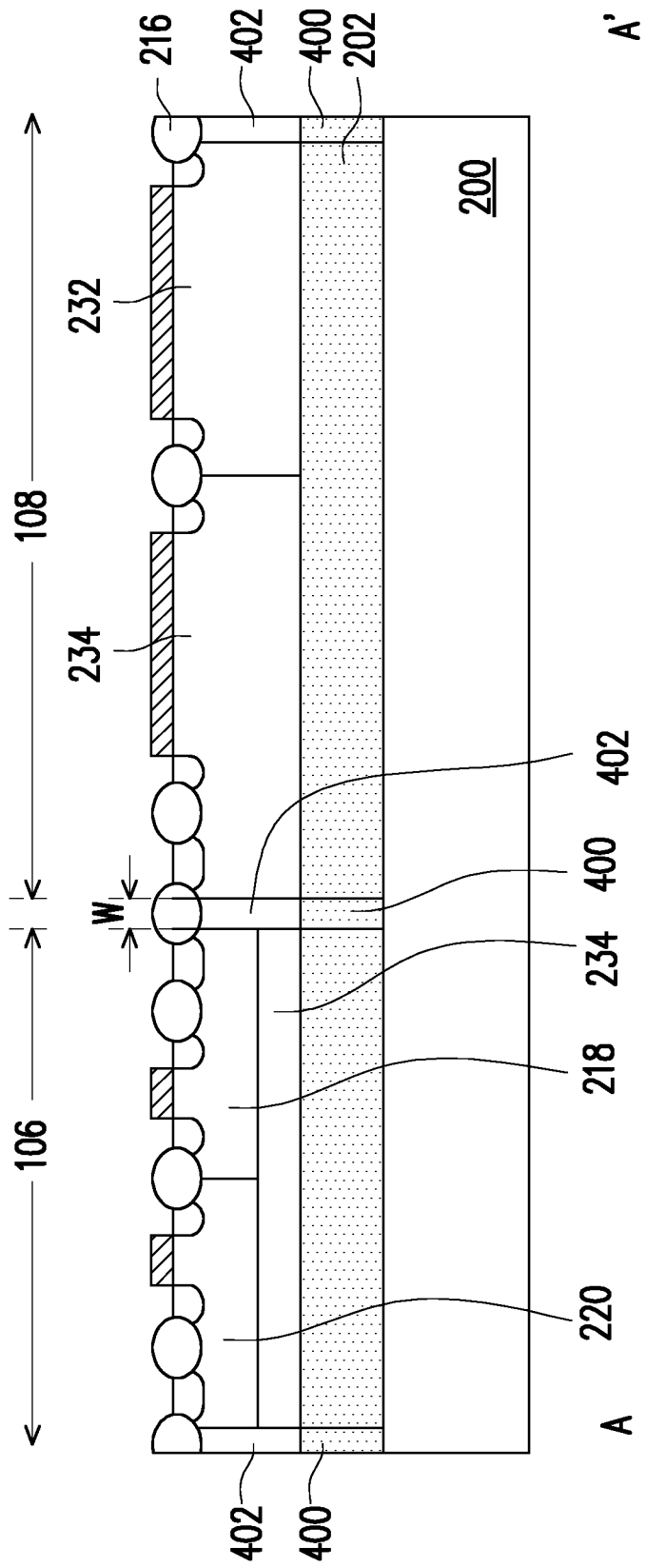
FIG. 4 is a cross-sectional schematic diagram of the third example of a high side region in the semiconductor apparatus taken along line A-A' in FIG. 1.

FIG. 4 is a cross-sectional schematic diagram of the third example of the high side region in the semiconductor apparatus taken along line A-A' in FIG. 1, wherein the same reference numerals as FIG. 2 are used to represent the same or similar components.

Referring to FIG. 4, in addition to the forms of FIG. 2 and FIG. 3, the isolation structures can also include a second conductivity type buried layer 400 and a second conductivity type isolation region 402, the second conductivity type isolation region 402 is located between the low voltage devices 106 and the high voltage devices 108 with different operating voltages, and the second conductivity type buried layer 400 is located between the first conductivity type buried layers 202 at the bottom of the second conductivity type isolation region 402. Therefore, when the first conductivity type buried layer 202 is an NBL, the second conductivity type buried layer 400 is a P-type buried layer (PBL), and the second conductivity type isolation region 402 is a P-type isolation region (PISO). On the other hand, if the first conductivity type buried layer 202 is a PBL, then the second conductivity type buried layer 400 and the second conductivity type isolation region 402 are an NBL and an N-type isolation region (NISO). Moreover, in order to avoid the second conductivity type isolation region 402 having higher doping concentration from affecting breakdown voltage (BV), the second conductivity type isolation region 402 is preferably fully depleted so as to obtain the highest BV.

In general, the width of the second conductivity type isolation region 402 (such as PISO) affects the BV; if the width is too large, then full depletion cannot be achieved and the BV is reduced, but a width that is too small readily results in punch through (isolation BV), and therefore a width W of the second conductivity type isolation region 402 is preferably determined with reference to each regional potential difference in the high side region, such as determined according to the potential difference of the devices with different operating voltages.

Figure 5:
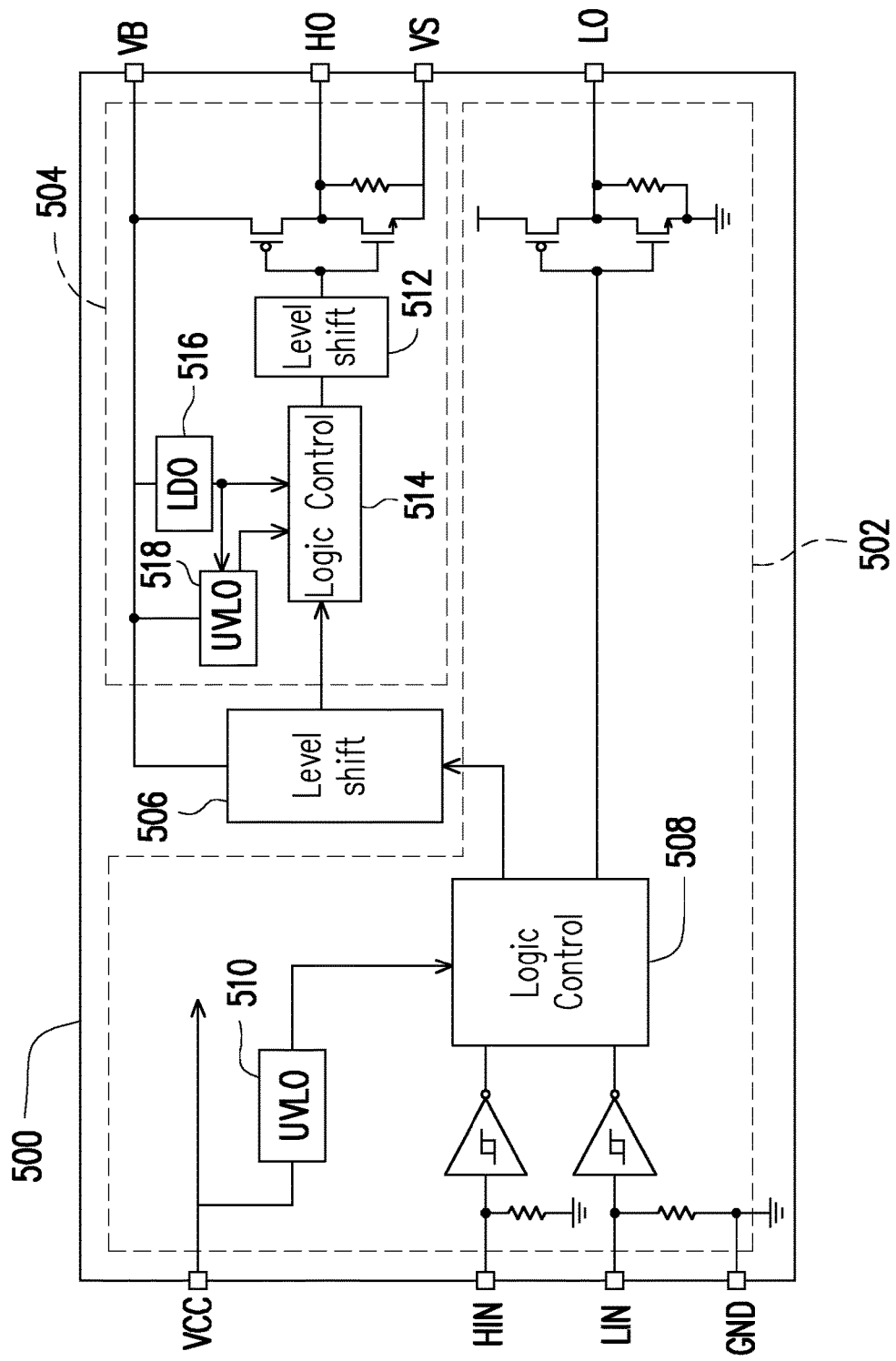
FIG. 5 is a circuit diagram of a semiconductor apparatus according to another embodiment of the invention.

FIG. 5 is a circuit diagram of a semiconductor apparatus 500 according to another embodiment of the invention. FIG. 5 shows a circuit 502 having a low side region and a circuit 504 having a high side region, and signal is transmitted from the low side region to the high side region via a level shift 506. The circuit 502 of the low voltage region has a low voltage lock (UVLO) 510 circuit, the UVLO 510 circuit can ensure the IC is not turned on before the VCC voltage reaches a safe operating voltage, and a logic control 508 mainly receives external logic input signals HIN and LIN for logical operation and outputs the signals to a low side output end LO and the level shift 506. The circuit 504 of the high side region has a low voltage lock (UVLO) 518 circuit, and the UVLO 518 circuit can ensure a logic control 514 is not turned on before the high side region VB-VS voltage reaches a safe operating voltage, and the logic control 514 receives a signal of the level shift 506 for logical operation and then converts the low voltage signal into a high voltage signal via a level shift 512 and outputs the signal to HO, wherein the logic control 514 and the UVLO 518 are low voltage devices, the power of the low voltage devices come from the output of an LDO 516, and the LDO 516 can convert the high voltage of the high side region VB-VS into a safe operating voltage for the low voltage devices. Therefore, the low voltage devices inside the high side region 504 can operate smoothly and without error from the high voltage of the VB-VS.

Figure 6:
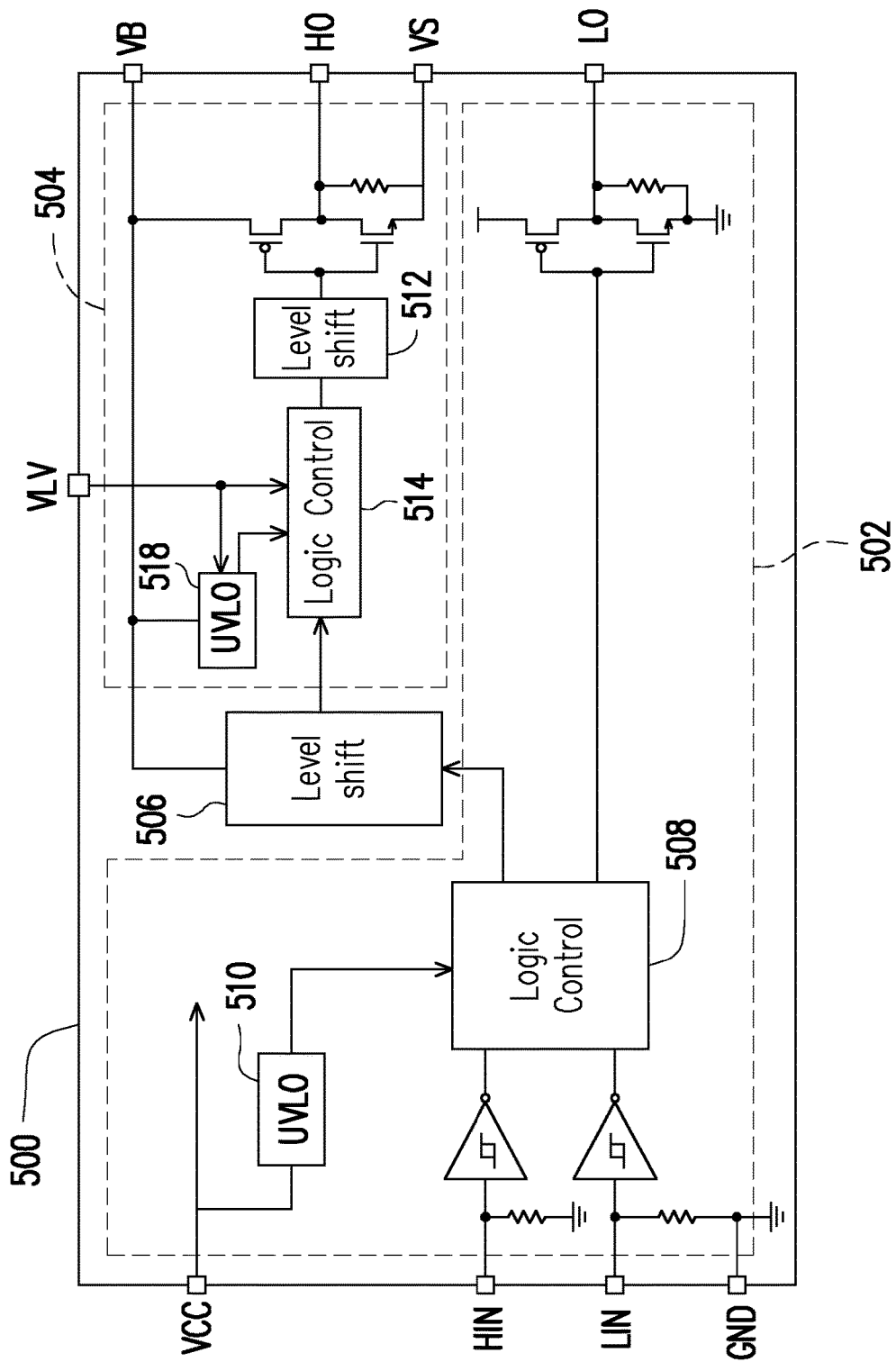
FIG. 6 is a circuit diagram of a semiconductor apparatus according to yet another embodiment of the invention.

In addition to the circuit diagram shown in FIG. 5, the semiconductor apparatus of the invention can also be executed by using other circuits, such as omitting the LDO 516 of FIG. 5 and directly adopting an external circuit to produce a low voltage of VLV as shown in FIG. 6 for providing lower voltage to the logic control 514 and the UVLO 518. The other circuit designs are as provided for the descriptions of FIG. 5 and are therefore not repeated herein.

Based on the above, high voltage devices and low voltage devices can both be disposed in the high side region of the semiconductor apparatus of the invention, and the effect of device size reduction can be achieved by the low voltage devices. Moreover, designing a regular logic operation using low voltage devices and then outputting at high voltage is more efficient. Moreover, in the invention, isolation structures are provided in the high side region to separate devices with different operating voltages, and therefore the issue of short circuit or leakage between the devices can be prevented.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor apparatus, comprising:
a high side region and a low side region, wherein the high side region comprises:
a plurality of semiconductor devices having low voltage devices and high voltage devices formed on a substrate, and the low voltage devices and the high voltage devices have different operating voltages;
a first conductivity type buried layer located between the substrate and the semiconductor devices including the low voltage devices and the high voltage devices; and
at least one isolation structure located between the low voltage devices and the high voltage devices and between the low voltage devices and the first conductivity type buried layer, wherein the isolation structure is a second conductivity type doped region completely surrounding the low voltage devices.

2. The semiconductor apparatus of claim 1, wherein a device size of the low voltage devices is less than a device size of the high voltage devices.

3. The semiconductor apparatus of claim 1, wherein the at least one isolation structure is further located between different low voltage devices.

4. The semiconductor apparatus of claim 1, wherein the low voltage devices comprise low voltage N-type metal oxide semiconductors (LV NMOS) and low voltage P-type metal oxide semiconductors (LV PMOS).

5. The semiconductor apparatus of claim 1, wherein the high voltage devices comprise high voltage NMOS (HV NMOS) and high voltage PMOS (HV PMOS).

6. The semiconductor apparatus of claim 1, wherein the first conductivity type buried layer is an N-type buried layer.

7. The semiconductor apparatus of claim 1, wherein the second conductivity type doped region is a P-type doped region.

8. The semiconductor apparatus of claim 1, wherein the second conductivity type isolation region is fully depleted.

9. The semiconductor apparatus of claim 1, wherein the first conductivity type buried layer is an N-type buried layer, the second conductivity type isolation region is a P-type isolation region, and the second conductivity type buried layer is a P-type buried layer.

10. The semiconductor apparatus of claim 1, wherein the first conductivity type buried layer is a P-type buried layer, the second conductivity type isolation region is an N-type isolation region, and the second conductivity type buried layer is an N-type buried layer.

11. The semiconductor apparatus of claim 1, wherein a width of the second conductivity type isolation region is determined according to a potential difference of the devices with different operating voltages.

* * * * *